United States Patent [19]
Hamasaki

[11] Patent Number: 5,094,964
[45] Date of Patent: Mar. 10, 1992

[54] METHOD FOR MANUFACTURING A BIPOLAR SEMICONDUCTOR DEVICE

[75] Inventor: Toshihiko Hamasaki, Yokohama, Japan

[73] Assignee: Kabushiki Kaisha Toshiba, Kawasaki, Japan

[21] Appl. No.: 515,621

[22] Filed: Apr. 27, 1990

[30] Foreign Application Priority Data

May 2, 1989 [JP] Japan .................................. 1-113309

[51] Int. Cl.$^5$ .................... H01L 21/331; H01L 21/205
[52] U.S. Cl. ...................................... 437/31; 437/131; 437/191; 437/32; 148/DIG. 11; 148/DIG. 124; 148/DIG. 72
[58] Field of Search ...................... 437/31, 32, 33, 233, 437/191, 131; 427/35, 70; 357/34, 16; 148/DIG. 11, DIG. 124, DIG. 72

[56] References Cited

U.S. PATENT DOCUMENTS 4,792,460 12/1988 Chu et al. .............................. 427/35

FOREIGN PATENT DOCUMENTS 54-106175 8/1979 Japan ................................. 357/34
1-173640 7/1989 Japan .
1-239880 9/1989 Japan .

OTHER PUBLICATIONS

Ghandhi, S. K., "VLSI Fabrication Principles", 1983, John Wiley & Sons, pp. 324–331.
Ghate, P. B., "Metallization for. . . ", *Thin Solid Films*, 93 (1982), 359–383.
Matsushita, T. et al., "A Silicon. . . ", *Appl. Phys. Lett.* 35 (7), 1, Oct. 1979, pp. 549–550.
Fujioka, H. et al., "Low Temperature Operation. . . ", Ext. Abs. 20th (1988) Conf. Solid State Dev. and Mat., Tokyo, 1988, pp. 125–128.
Malin, K., "High Performance. . . ", *IBM Technical Disclosure Bulletin*, vol. 20, No. 4, Sep. 1977, pp. 1495–1496.
Symon, J. et al., "Silicon Heterojunction. . . ", Solid State Electronics, vol. 30, No. 11, 1987, pp. 1143–1145.
IEDM Technical Digest, p. 190 (1987), H. Fujioka et al.
Appl. Phys. Lett. vol. 44, No. 11, pp. 1049–1051 (1984), T. Hamasaki et al.
Jpn. J. Appl. Phys. vol. 23, No. 2, p. L81 (1984), T. Hamasaki et al.

*Primary Examiner*—Brian E. Hearn
*Assistant Examiner*—T. N. Quach
*Attorney, Agent, or Firm*—Oblon, Spivak, McClelland, Maier & Neustadt

[57] ABSTRACT

In a method for manufacturing a heterojunction bipolar transistor using a silicon microcrystal as an emitter, a mask 4 having an opening on an element forming region of the main surface of an n-type silicon monocrystal substrate 1 serving as a collector, a p-type outer base 5 is formed on a part of the element forming region of the main surface of the substrate via the opening of the mask 4 by ion-implanting p-type impurity therein, a p-type inner base 6 is formed on the entire surface of the element forming region of the substrate 1 by ion-implanting p-type impurity therein after removing the mask 4, and an n-type emitter 8 is formed by depositing an n-type silicon microcrystal layer on the inner base 6 at a growth velocity of 15 Å/sec by a plasma chemical vapor deposition method in a state that the temperature of said substrate 1 is maintained at a constant temperature between 460° to 550° C.

12 Claims, 5 Drawing Sheets

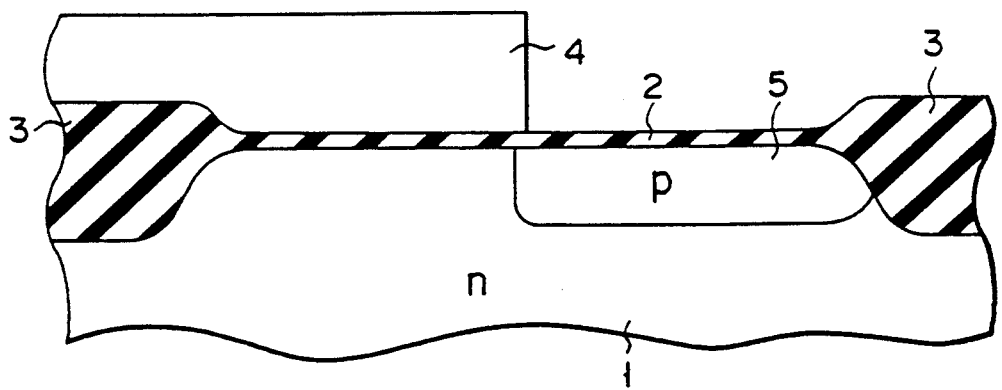
F I G. 1A
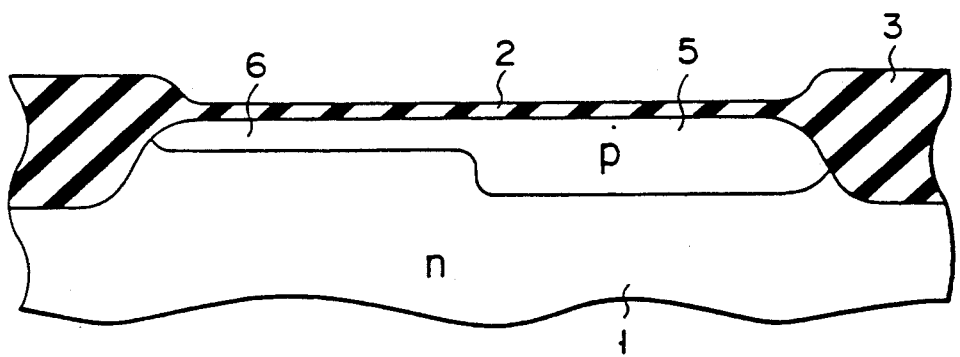
F I G. 1B
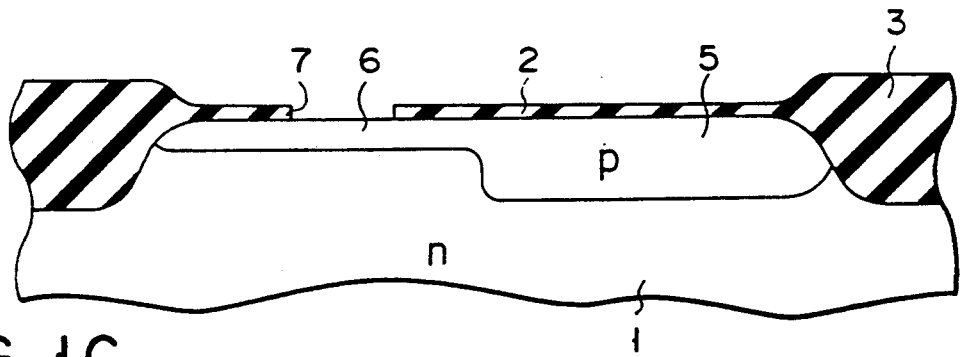
F I G. 1C
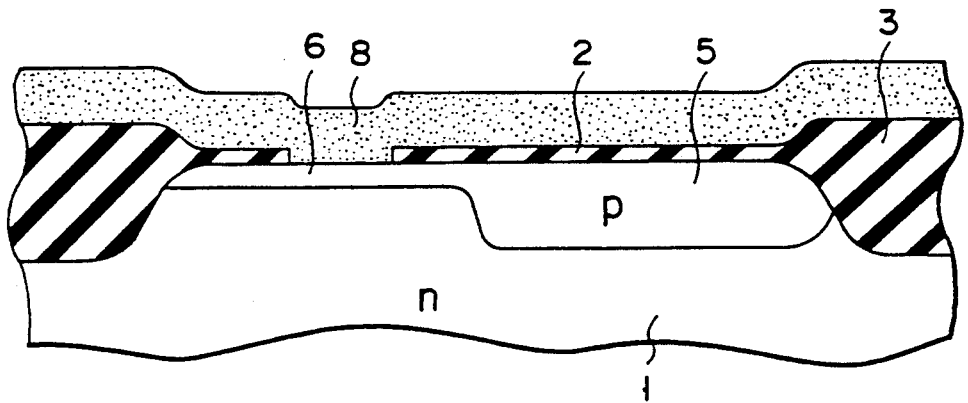
F I G. 1D

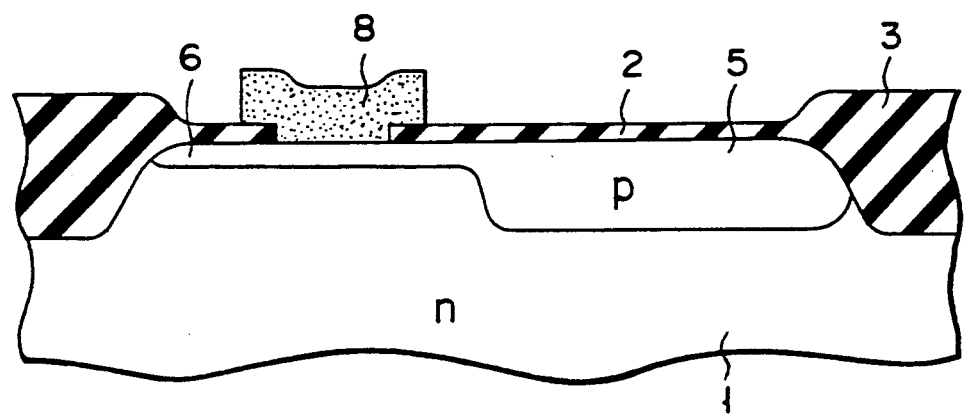
F I G. 1E
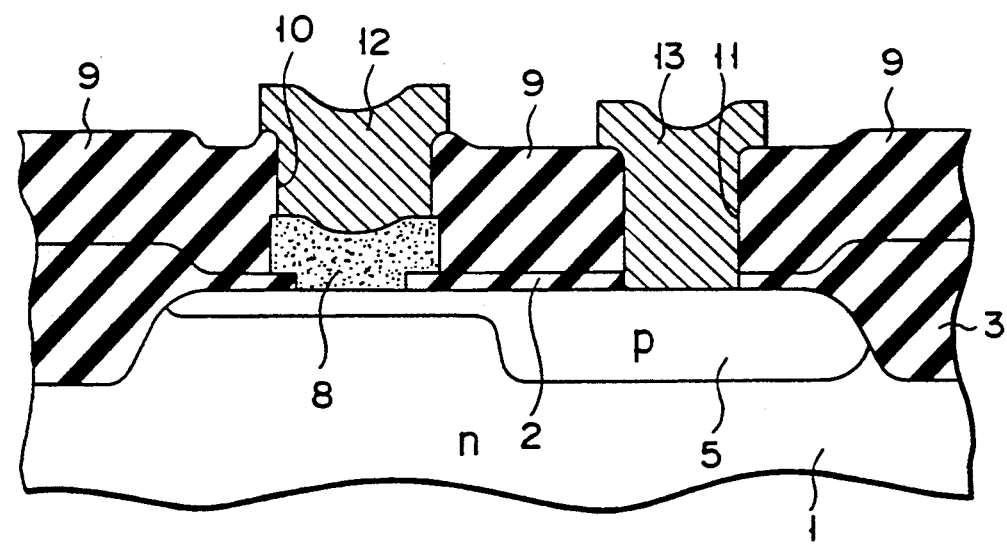
F I G. 1F

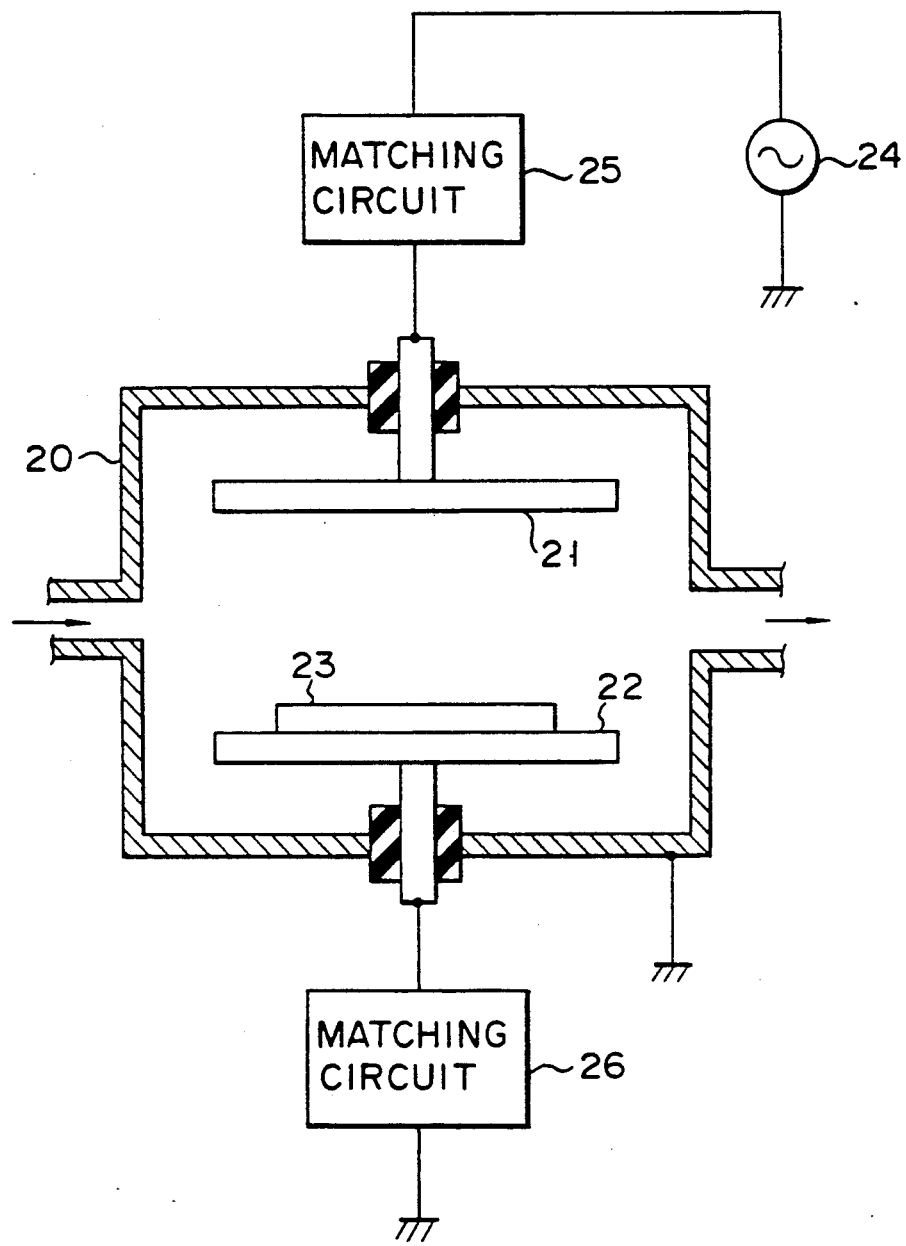
F I G. 2

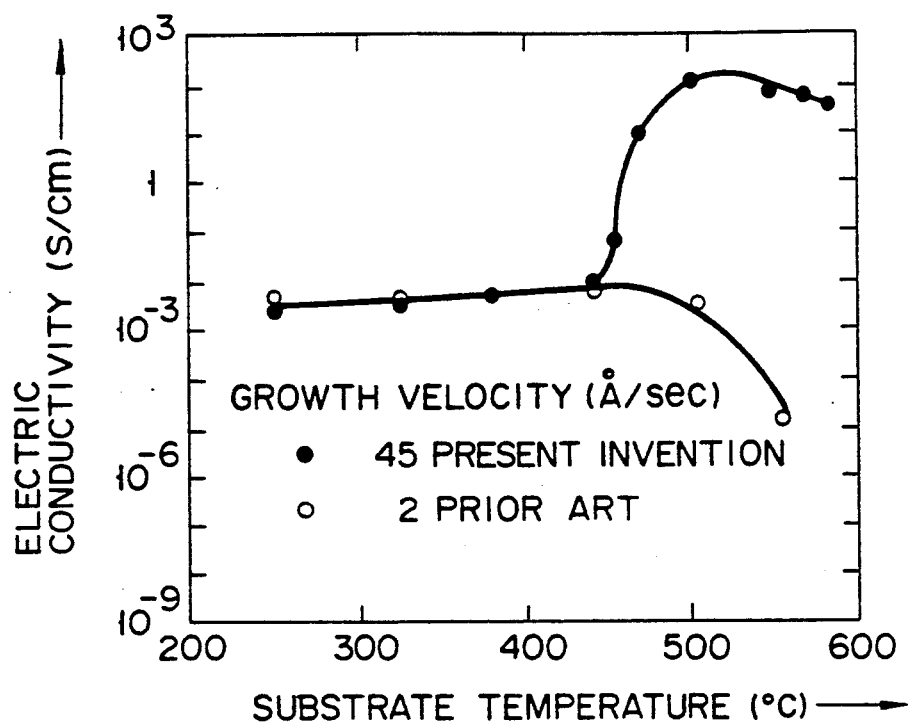
F I G. 3
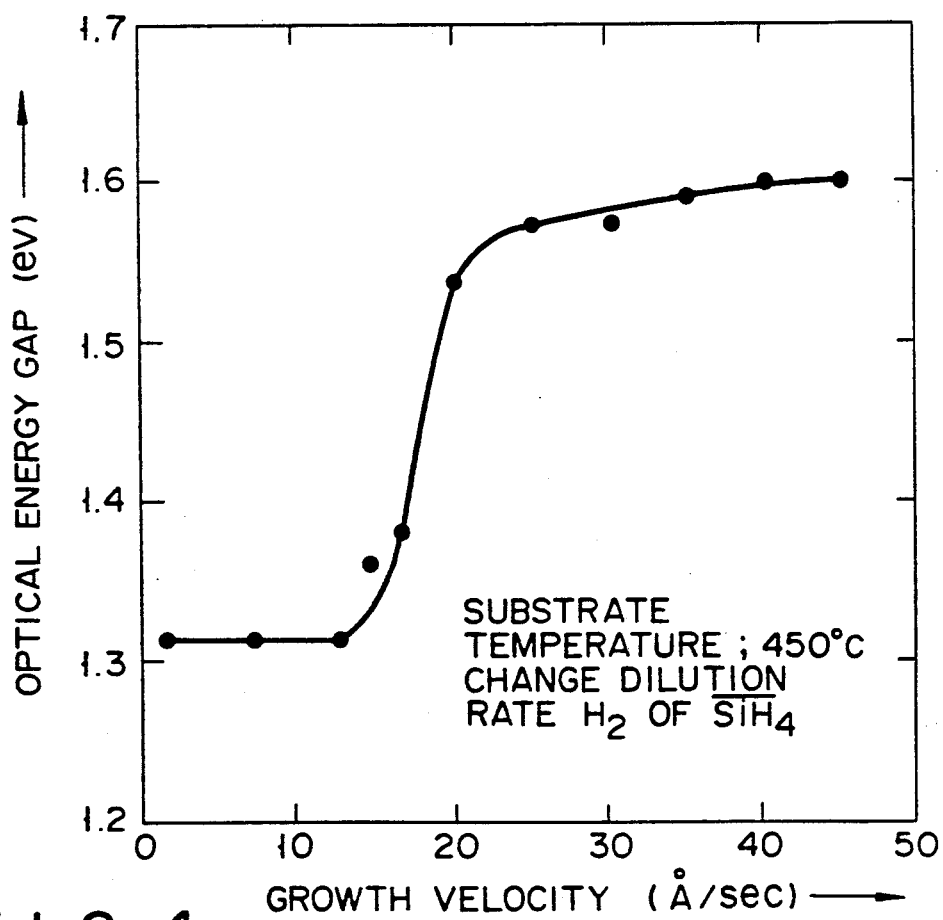
F I G. 4

METHOD FOR MANUFACTURING A BIPOLAR SEMICONDUCTOR DEVICE

BACKGROUND OF THE INVENTION

1. Field of the Invention

The present invention relates to a method for manufacturing a semiconductor device comprising a bipolar integrated circuit and, more particularly to a method for manufacturing a semiconductor device using silicon microcrystal as an emitter.

2. Description of the Related Art

Conventionally, as one of the heterojunction bipolar transistor which can ensure a sufficient amplification factor even at the temperature of liquid nitrogen (77K), there has been proposed a technique in which a silicon microcrystal is used as an emitter. For example, as is disclosed in the article by Fujoika et. al. titled "Low Temperature operation of a Si HBT" in proceedings of "Conference on Solid State Devices and Materials", pp. 125-128 (1988), by the use of silicon microcrystal layers deposited by a plasma chemical vapor deposition method, there is provided a ring oscillator of an ECL comprising a heterojunction bipolar transistor.

However, in this type of the semiconductor device, the following problems occurred.

Specifically, when this semiconductor device is operated at the temperature of liquid nitrogen (77K), gate delay time becomes relatively large, e.g. 295 (ps). One of reasons why the gate delay time becomes large is that a connected resistance between an aluminum electrode and a silicon microcrystal layer is increased. Since the temperature is low such as 250° C. to 450° C. when the microcrystals are deposited, heat treatment after the deposition of the aluminum electrode cannot be sufficiently performed. If the heat treatment is performed at a high temperature to reduce the connected resistance, the quality of the silicon microcrystal is changed and its band gap is narrowed. As a result, the heterojunction between the emitter and base, which is a feature of the structure of this type of transistor, is lost.

As mentioned above, in the conventional heterojunction bipolar transistor using a silicon microcrystal layer as an emitter, if the temperature of the heat treatment after the deposition of the silicon microcrystals is low, the connected resistance between the aluminum electrode and the silicon microcrystal layer is increased. Oppositely, if the temperature of the heat treatment is high, the quality of the silicon microcrystal is changed, thereby heterojunction is lost.

SUMMARY OF THE INVENTION

An object of the present invention is to provide a method for manufacturing a semiconductor device which can sufficiently perform a heating step after the deposition of silicon microcrystal layers, particularly, the heat treatment after the deposition of aluminum electrodes without changing the quality of the silicon microcrystal layer and reduce a connected resistance between the aluminum electrode and the silicon microcrystal layer, and contribute to improvement in the performance of an element.

To attain the above object, the present invention uses the following structure.

According to the present invention, in a method for manufacturing a semiconductor device using a silicon microcrystal as an emitter, a second conductive-type region (base) is formed on a part of the main surface of a first conductive-type silicon single crystal substrate (collector). Thereafter, a first conductive silicon microcrystal layer (emitter) is deposited on a second conductive-type region at a depositing speed of 15 Å/sec or more by a plasma chemical vapor deposition method under a state that the substrate temperature is maintained constant between 460° to 560° C.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 1A to 1F are cross sectional views showing manufacturing steps of a heterojunction bipolar transistor relating to an embodiment of the present invention;

FIG. 2 is a schematic structural view showing one example of a plasma chemical vapor deposition device used in the above embodiment;

FIGS. 3 to 6 are diagrams for explaining effect of the present invention, respectively;

FIG. 3 is a characteristic diagram showing a change of electric conductivity with respective to a substrate temperature;

FIG. 4 is a characteristic diagram showing a change of an optical energy gap with respective to growth velocity;

FIG. 5 is a characteristic diagram showing a change of the content of hydrogen with respect to the substrate temperature; and FIG. 6 is a characteristic diagram showing a change of an optical energy gap with respective to the substrate temperature.

DETAILED DESCRIPTION OF THE PREFERRED EMBODIMENTS

Figure 5:
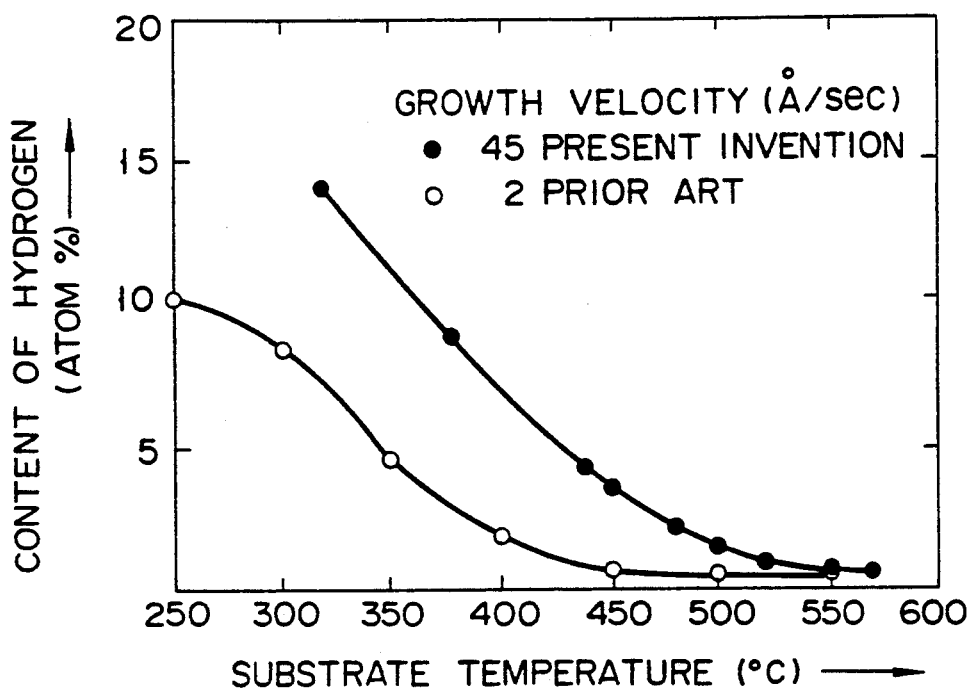

Before explaining an embodiment of the present invention, the principle of the present invention will be explained.

The inventors of the present invention found out that in a silicon thin film deposited at a speed of over 40 Å/sec by the use of a plasma chemical vapor deposition, a specific resistance and a characteristic of a band gap and the like are not changed with respective to the temperature of the heat treatment of 450° to 550° C. (for example, Jpn. J. Appl.Phys. vol. 23 (1984) p.L81).

In addition to the above, the inventors of the present invention found out that the substrate temperature was maintained constant between 460° C. and 550° C., and the silicon thin film deposited at a speed of over 15 Å/sec was microcrystallized, and the specific resistance is low, and the band gap of 1.3 eV or more was provided. Then, it was confirmed that the above-formed silicon microcrystal layer was not changed in its characteristic even if the heat treatment was performed at a temperature of 450° C.

In view of the above fact, in a chamber where a silicon microcrystals are deposited, the heat treatment (e.g., 450° C.) after the formation of an aluminum electrode can be sufficiently performed without changing the characteristic of the silicon microcrystal layer by setting the substrate temperature and the deposition speed to 460° to 550° C. In other words, since the substrate temperature at the time when the silicon microcrystals are deposited is set to 460° to 550° C., the quality of the silicon microcrystal is not changed even if the heat treatment after the formation of the aluminum electrode is performed at temperature of 450° C. or less. The temperature of 450° C. is a sufficient temperature as a heat treatment temperature of the formation of aluminum. Therefore, it is possible to reduce the connected resistance between the aluminum electrode and the silicon microcrystal without losing heterojunction between emitter and base, thereby improving the performance of the element.

An embodiment of the present invention will be explained with reference to the drawings.

FIGS. 1A to 1F are cross sectional views showing the manufacturing steps of a heterojunction bipolar transistor relating to the present invention.

As shown in FIG. 1A, a silicon oxide film 2 having thickness of, for example, 500 Å is formed on a main surface of an n-type silicon substrate 1. Moreover, a field oxide film 3 having thickness of, for example, 4000 Å is formed thereon. Here, the substrate 1 serves as a collector. Thereafter, a resist mask 4 is formed thereon and boron (B) ion is implanted into the portion where the mask 4 is not formed with acceleration voltage of 20 Kv and amount of implantation of $3 \times 10^{14}$ cm$^{-2}$, thereby forming a p-type semiconductor region (outer base) 5.

Next, as shown in FIG. 1B, after the resist mask 4 is removed, B ion is implanted into the entire portion with acceleration voltage of 10 KV and amount of implantation of $5 \times 10^{13}$ cm$^{-2}$, thereby forming a p-type semiconductor region (inner base) 6. Sequentially, a lamp heating process having 1000° C., 10 seconds is performed thereon, and impurity of the p-type semiconductor regions 5 and 6 are activated.

Next, a resist mask (not shown) is formed to have a predetermined pattern, and as shown in FIG. 1C an opening portion 7 having width of 1.2 μm is formed on a portion of the silicon oxide film 2 on the p-type semiconductor region 6. Moreover, as shown in FIG. 1D, a silicon microcrystal layer (emitter) 8 to which phosphorus (P) is added is deposited on the entire surface of the substrate by a plasma chemical vapor deposition method. The film thickness of the silicon microcrystal layer 8 may be, for example, 1500 Å.

Here, in the growth of the silicon microcrystal layer 8, a plasma close-type CVD apparatus, which is a high frequency tuning circuit type for a substrate electrode as shown in FIG. 2, is used (for example, see Appl.-Phys.Lett. vol. 44, (1984) p.1049). In the drawing, reference numeral 20 is an reaction chamber; 21, 22: parallel plane electrodes; 23: a processing substrate; 24: a high frequency power source; and 25, 26: matching circuits. This apparatus is characterized in that the matching circuit is provided on not only the side of a cathode 21 but also the side of an anode 22 thereby improving a d.c. potential in the surface of the substrate.

By the CVD apparatus shown in FIG. 2, the growth of the silicon microcrystal layer 8 was performed in such a manner that mixed gas of SiH$_4$ (100%) and PH$_3$ (10% of H$_2$ dilution) was used as main gas and gas was activated by high frequency discharge of 13.56 MHz, and substrate temperature was maintained at 500° C. At this time, reaction concentration (gas flow rate) was increased and growth velocity was set 45 Å/sec. In the conventional growth condition, growth velocity was approximately 2 to 10 Å/sec. Table 1 shows the other details of the growth condition, and Table 2 shows the characteristics of the silicon microcrystal obtained by the above method.

TABLE 1

| | |
|---|---|
| Substrate Temperature | 500° C. |
| Discharging Power | 60 W |
| Discharging Gas Pressure | 0.5 Torr |
| Gas Flow Rate | |
| SiH$_4$ | 50 cm$^3$/min |
| PH$_3$ (10% of H$_2$ dilution) | 8 cm$^3$/min |
| Growth Velocity | 45 Å/sec |

TABLE 2

| | |
|---|---|
| Conductivity | 100 (Ω · cm)$^{-1}$ |
| Optical Energy Gap | 1.5 eV |
| Microcrystal Grain Diameter | 500 Å |

As shown in FIG. 1E, the silicon microcrystal layer 8 other than an emitter region is removed by a reactive ion etching using a resist mask (not shown). Then, as shown in FIG. 1F, an oxide film 9 having thickness of 3000 Å is deposited on the entire surface of the substrate by a chemical vapor deposition method. Thereafter, opening portions 10 and 11 for connecting the silicon microcrystal layer 8 to the outer based 5 are formed on the oxide film 9 by the reactive ion etching. Thereafter, an aluminum film is spatter-evaporated on the entire surface of the substrate so as to sufficiently embed aluminum in the opening portions 10 and 11. Then, the aluminum film is selectively etched by reactive ion etching using the resist mask, thereby forming electrodes 12 and 13 comprising the aluminum film on the opening portions 10 and 11. Subsequently, the heat treatment is performed in nitrogen atmosphere at 450° C. for 15 minutes, thereby improving the electric contact between the silicon microcrystal layer 8, the outer base 5 and the aluminum electrodes 12, 13, respectively. The connected resistance between the above-manufactured silicon microcrystal layer 8 and the aluminum electrode 12 according to the above embodiment was a sufficiently low value of $1 \times 10^{-7}$ Ω/cm$^2$. Moreover, the energy gap of the silicon microcrystal layer 8 was 1.5 eV, which was the same as the value before the heat treatment was performed. The value was sufficiently large to perform the heterojunction between the inner base 8 and the emitter.

The inventors of the present invention changed the substrate temperature variously so as to check conductivity, content of hydrogen and the characteristic of the optical energy gap. The results are shown in FIGS. 3 to 5.

FIG. 3 shows the change of electric conductivity with respective to the substrate temperature. As shown in the drawing, in a chamber where the growth velocity is 45 Å/sec, electric conductivity abruptly rises if the substrate temperature exceeds 460° C. In contrast, in a chamber where growth velocity is conventionally 2 Å/sec, conductivity falls if the substrate temperature exceeds 460° C. Additionally, in a chamber where the growth velocity is 15 Å/sec or more, conductivity rises at the substrate temperature of 460° C. or more.

FIG. 4 is a characteristic diagram showing the change of the optical energy gap with respective to the growth velocity when the silicon microcrystal layer is grown under conditions shown in Table 3. Here, the growth velocity changes dilution rate of SiH$_4$, thereby controlling the growth velocity. For example, if diluent hydrogen gas rate is increased, the growth velocity is also increased.

TABLE 3

| Substrate Temperature | 500° C. |
|---|---|
| Discharging Power | 60 W |
| Discharging Gas Pressure | 0.5 Torr |
| PH$_3$ (dilution rate of H$_2$) | 10% |
| SiH$_4$ (dilution rate of H$_2$) | 1 to 100% |
| Gas Flow Rate | |
| PH$_3$ + H$_2$ | 8 cm$^3$/min. |
| SiH$_4$ + H$_2$ | 50 cm$^3$/min. |

As shown in the drawing, the optical energy gap is remarkably improved when the growth velocity exceeds approximately 15 Å/sec. Moreover, when the growth velocity exceeds 20 Å/sec or more, high optical energy gap of 1.6 eV can be maintained. Here, it is desirable that a process condition be set to the growth velocity of 20 Å/sec or more in order to obtain a stable crystal film. Moreover, the characteristic of FIG. 4 shows substantially the same characteristic even if the gas flow rate or the discharging gas pressure is changed. Therefore, it turns out that the optical energy gap does not depend on these conditions.

Figure 6:
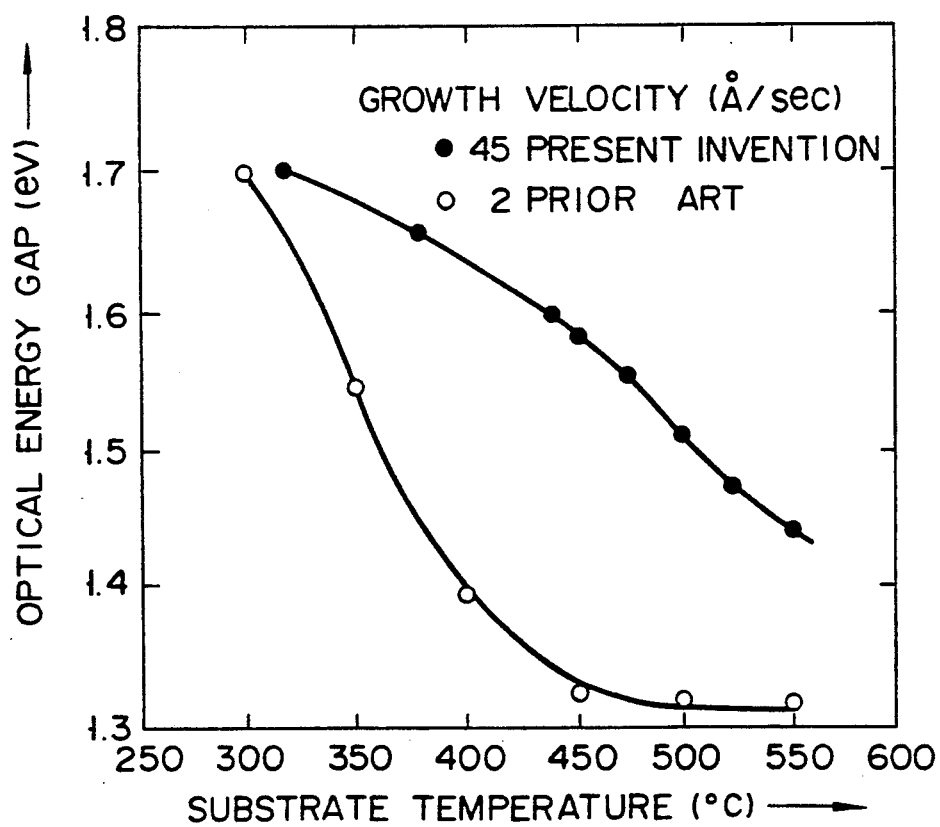

FIG. 5 is a characteristic diagram showing the change of the content of hydrogen with respective to the substrate temperature. As compared with the prior art, it turns out from this drawing that the content of hydrogen increases at any temperatures in the present invention. FIG. 6 is a characteristic diagram showing the change of the energy gap with respective to the substrate temperature. It turns out from the drawing that if the growth velocity is increased as in the present invention, the energy cap becomes sufficiently large.

As mentioned above, it turned out that conductivity was improved and the band gap become sufficiently large in a chamber where the substrate temperature was 460° C. or more and the growth velocity was 15 Å/sec or more in growing the silicon microcrystal layer. Moreover, it turns out that the characteristics such as conductivity, band gap and the like are not changed with respective to the temperature of the heat treatment of approximately 450° C. if the growth velocity is 20 Å/sec or more. Therefore, regarding the conditions in growing the silicon microcrystal layer, the substrate temperature may be a constant temperature of 460° C. or more and the growth velocity may be 15 Å/sec, preferably 20 Å/sec or more. Additionally, if the substrate temperature is too high, both conductivity and energy gap are lowered, thereby bringing about various kinds of disadvantages. Therefore, it is desirable that the upper limit of the substrate temperature be approximately 550° C.

In other words, according to the present invention, when the silicon microcrystal layer 8 using an emitter is formed by the plasma chemical vapor deposition method, the substrate temperature is maintained at the constant temperature between 460° C. and 550° C., and the growth velocity is set 15 Å/sec or more, preferably 20 Å or more. Thereby, the connected resistance between the aluminum electrode 12 and the silicon microcrystal layer 8 can be reduced without losing the heterojunction between the emitter and the base, and a heterojunction bipolar transistor having good element characteristic can be realized.

In the above embodiment, SiH$_4$ was used as main gas in the growth of the silicon microcrystal layer. In place of SiH$_4$, Si$_2$H$_6$ can be used. Moreover, it is possible to use mixed gas of SiF$_4$ and SiH$_4$, or SiF$_4$ and Si$_2$F$_6$. Also, He, Ar and the like may be used as diluent gas. Moreover, the plasma discharging condition in growing the silicon microcrystal layer may be suitably changed within the range that the growth velocity of 15 Å/sec or more is obtained.

Additional advantages and modifications will readily occur to those skilled in the art. Therefore, the invention in its broader aspects is not limited to the specific details, and illustrated examples shown and described herein. Accordingly, various modifications may by without departing from the spirit or scope of the general inventive concept as defined by the appended claims and their equivalents.

What is claimed is:

1. A method for manufacturing a semiconductor device using silicon microcrystal, comprising the step of:
    depositing a first conductive-type silicon microcrystal layer on a second conductive-type silicon substrate at a growth velocity of 15 Å/sec or more by a plasma chemical vapor deposition method in a state that the temperature of said second conductive-type silicon substrate is maintained at a constant temperature between 460° and 550° C., wherein during said step of depositing said substrate is arranged in a chamber having a parallel plane electrode, SiH$_4$ gas is introduced into the chamber, high frequency voltage is applied between the parallel plane electrode, and said SiH$_4$ gas is activated by high frequency discharging generated between the parallel plane electrode.

2. The method for manufacturing a semiconductor device according to claim 1, wherein the growth velocity of said silicon microcrystal layer is 20 Å/sec or more.

3. The method for manufacturing a semiconductor device according to claim 1, wherein said silicon microcrystal layer is a crystal containing hydrogen.

4. A method for manufacturing a bipolar type semiconductor device using a silicon microcrystal, comprising the steps of:
    forming a second conductive-type region on a part of the main surface of a first conductive-type silicon monocrystal substrate; and
    depositing a first conductive-type silicon microcrystal layer on said second conductive-type silicon substrate at a growth velocity of 15 Å/sec or more by a plasma chemical vapor deposition method in a state that the temperature of said substrate is maintained at a constant temperature between 460° to 550° C., wherein during said step of depositing said silicon microcrystal layer, said substrate is arranged in a chamber having a parallel plane electrode, SiH$_4$ gas is introduced into the chamber, high frequency voltage is applied between the parallel plane electrode, and mixed gas is activated by high frequency discharging generated between the parallel plane electrode.

5. The method for manufacturing a bipolar type semiconductor device according to claim 4, wherein the growth velocity of said silicon microcrystal layer is 20 Å/sec or more.

6. The method for manufacturing a bipolar type semiconductor device according to claim 4, wherein said silicon microcrystal layer is a crystal containing hydrogen.

7. A method for manufacturing a bipolar type semiconductor device using a silicon microcrystal, comprising the steps of:

forming a second conductive-type region on a part of an element forming region of the main surface of a first conductive-type silicon monocrystal substrate serving as a collector by ion-implanting a second conductive-type impurity;

forming a second conductive-type inner base on the entire surface of the element forming region of said substrate or a surface other than said outer base by ion-implanting the second conductive-type impurity therein; and forming a first conductive-type emitter by depositing a first conductive-type silicon microcrystal layer on said inner base at a growth velocity of 15 Å/sec or more by a plasma chemical vapor deposition method in a state that the temperature of said substrate is maintained at a constant temperature between 460° to 550° C., wherein during the step of depositing said silicon microcrystal layer, said substrate is arranged in a chamber having a parallel plane electrode, SiH$_4$ is introduced into the chamber, high frequency voltage is applied between the parallel plane electrode, and said gas is activated by high frequency discharging generated between the parallel plane electrode.

8. The method for manufacturing a bipolar type semiconductor device according to claim 7, wherein the growth velocity of said silicon microcrystal layer is 20 Å/sec or more.

9. The method for manufacturing a bipolar type semiconductor device according to claim 7, wherein said silicon microcrystal layer is a crystal containing hydrogen.

10. A method for manufacturing a bipolar type semiconductor device using a silicon microcrystal, comprising the steps of:

forming a mask having an opening on an element forming region of the main surface of an n-type silicon monocrystal substrate serving as a collector;

forming a p-type outer base on a part of the element forming region of the main surface of said substrate via the opening of said mask by ion-implanting p-type impurity therein;

forming a p-type inner base on the entire surface of the element forming region of said substrate by ion-implanting p-type impurity therein after removing said mask; and forming an n-type emitter by depositing an n-type silicon microcrystal layer on said inner base at a growth velocity of 15 Å/sec or more by a plasma chemical vapor deposition method in a state that the temperature of said substrate is maintained at a constant temperature between 460° to 550° C., wherein said substrate is arranged in a chamber having a parallel plane electrode, SiH$_4$ gas is introduced into the camber, high frequency voltage is supplied between the parallel plane electrode, and said gas is activated by high frequency discharging generated between the parallel plane electrode.

11. The method for manufacturing a bipolar type semiconductor device according to claim 10, wherein the growth velocity of said silicon microcrystal layer is 20 Å/sec or more.

12. The method for manufacturing a bipolar type semiconductor device according to claim 10, wherein said silicon microcrystal layer is a crystal containing hydrogen.

* * * * *